United States Patent
Kuo

(10) Patent No.: US 8,237,184 B2
(45) Date of Patent: Aug. 7, 2012

(54) LIGHT-EMITTING SEMICONDUCTOR DEVICE

(75) Inventor: Shiou-Yi Kuo, Kaohsiung (TW)

(73) Assignee: HUGA Optotech Inc., Taichung (TW)

( * ) Notice: Subject to any disclaimer, the term of this patent is extended or adjusted under 35 U.S.C. 154(b) by 0 days.

(21) Appl. No.: 13/071,511

(22) Filed: Mar. 25, 2011

(65) Prior Publication Data
US 2012/0085989 A1 Apr. 12, 2012

(30) Foreign Application Priority Data
Oct. 6, 2010 (TW) ................................ 99134086 A

(51) Int. Cl.
*H01L 33/00* (2010.01)
*H01J 63/04* (2006.01)
(52) U.S. Cl. .................... 257/98; 257/E33.001; 313/506
(58) Field of Classification Search .................... 257/13, 257/79, 98, 99, E33.001; 313/504, 505, 503, 313/506
See application file for complete search history.

(56) References Cited

U.S. PATENT DOCUMENTS

| 6,797,987 B2 | 9/2004 | Chen |
| 7,498,609 B2 | 3/2009 | Murofushi et al. |
| 2006/0076565 A1* | 4/2006 | Murofushi et al. ............. 257/79 |
| 2008/0315220 A1 | 12/2008 | Lee et al. |
| 2009/0020776 A1* | 1/2009 | Lin et al. ......................... 257/98 |

FOREIGN PATENT DOCUMENTS

| TW | 577178 | 2/2004 |
| TW | I230472 | 4/2005 |
| TW | 200627670 | 8/2006 |

* cited by examiner

*Primary Examiner* — A. Sefer
*Assistant Examiner* — Nikolay Yushin
(74) *Attorney, Agent, or Firm* — Jianq Chyun IP Office

(57) ABSTRACT

A semiconductor light-emitting device includes a conductive substrate, a light-emitting structure layer, a metallic reflective layer, a transparent conductive layer, a first patterned dielectric layer, and a second patterned dielectric layer. The light-emitting structure layer, the transparent conductive layer, the metallic reflective layer, and the conductive substrate are sequentially arranged. The first patterned dielectric layer is between the light-emitting structure layer and the transparent conductive layer and includes first structure units separated from one another by a first space. The first portions are located in the first spaces respectively. The second patterned dielectric layer is between the transparent conductive layer and the metallic reflective layer and includes second structure units separated from one another by a second space. The second portions are located in the second spaces respectively. The first and the second portions are not overlapped.

11 Claims, 3 Drawing Sheets

LIGHT-EMITTING SEMICONDUCTOR DEVICE

CROSS-REFERENCE TO RELATED APPLICATION

This application claims the priority benefit of Taiwan application serial no. 99134086, filed Oct. 6, 2010. The entirety of the above-mentioned patent application is hereby incorporated by reference herein and made a part of this specification.

BACKGROUND OF THE INVENTION

1. Field of the Invention

The invention relates to a semiconductor light-emitting device. More particularly, the invention relates to a vertical semiconductor light-emitting device.

2. Description of Related Art

In recent years, luminescence efficiency of light-emitting diodes (LEDs) has been continuously improved. Consequently, fluorescent lamps and incandescent bulbs are gradually replaced with LEDs in some application areas, such as scanning light sources which require high response speed, back or front light sources of liquid crystal displays (LCDs), automobile dashboard illumination, traffic signs, and general illumination devices. Common LEDs are usually semiconductor devices which are made of III-V group compounds, such as GaP, GaAs, and so on. Basically, the LED converts electric energy into light. Specifically, an electric current is applied to the aforesaid semiconductor compound and, through the combination of electrons and holes, excessive energy can be released in the form of light.

FIG. 1 is a schematic cross-sectional view illustrating a conventional LED chip. With reference to FIG. 1, the LED chip 200 includes a light-emitting structure layer 110, a bonding layer 120, a conductive substrate 130, an n-type electrode 142, a p-type electrode 144, a metallic reflective layer 250, and a transparent conductive layer 260. The light-emitting structure layer 110 is configured on the conductive substrate 130, and the bonding layer 120 is located between the light-emitting structure layer 110 and the conductive substrate 130. The light-emitting structure layer 110 has a p-type semiconductor layer 112, an n-type semiconductor layer 114, and an active layer 116 located between the p-type semiconductor layer 112 and the n-type semiconductor layer 114. The n-type electrode 142 is configured on a surface of the n-type semiconductor layer 114 away from the light-emitting structure layer 110, and the p-type electrode 144 is configured on a surface of the conductive substrate 130 away from the light-emitting structure layer 110. The metallic reflective layer 250 is configured between the bonding layer 120 and the light-emitting structure layer 110, and the transparent conductive layer 260 is configured between the metallic reflective layer 250 and the light-emitting structure layer 110. That is to say, the LED chip 200 not only includes the light-emitting structure layer 110, the bonding layer 120, the conductive substrate 130, the electrode 142, the electrode 144, and the metallic reflective layer 250 but also includes the transparent conductive layer 260 configured between the metallic reflective layer 250 and the light-emitting structure layer 110.

In the LED chip 200, the metallic reflective layer 250 has the light reflection properties, while the transparent conductive layer 260 has the ohmic conductive properties. However, during fabrication of the LED chip 200, heat treatment is required, which is likely to cause mutual diffusion between the transparent conductive layer 260 and the metallic reflective layer 250. Thereby, the metallic reflective layer 250 is atomized during fabrication of the LED chip 200, reflectivity of the metallic reflective layer 250 is reduced, and luminance efficiency of the LED chip 200 is deteriorated.

SUMMARY OF THE INVENTION

The invention is directed to a semiconductor light-emitting device characterized by favorable reflectivity.

The invention provides a semiconductor light-emitting device that includes a conductive substrate, a light-emitting structure layer, a metallic reflective layer, a transparent conductive layer, a first patterned dielectric layer, and a second patterned dielectric layer. The light-emitting structure layer is configured above the conductive substrate. The metallic reflective layer is configured between the light-emitting structure layer and the conductive substrate. The transparent conductive layer is configured between the light-emitting structure layer and the metallic reflective layer. The first patterned dielectric layer is configured between the light-emitting structure layer and the transparent conductive layer. The first patterned dielectric layer includes a plurality of first structure units. The first structure units are separated from one another by a first space, and first portions of the transparent conductive layer are located in the first spaces, respectively. The second patterned dielectric layer is configured between the transparent conductive layer and the metallic reflective layer. Besides, the second patterned dielectric layer includes a plurality of second structure units. The second structure units are separated from one another by a second space, and second portions of the transparent conductive layer are located in the second spaces, respectively. The first portions and the second portions are not overlapped.

According to an embodiment of the invention, the semiconductor light-emitting device further includes a first electrode and a second electrode. The first electrode is configured at a side of the light-emitting structure layer away from the conductive substrate. The second electrode is configured at a side of the conductive substrate away from the light-emitting structure layer.

According to an embodiment of the invention, an electrode pattern projection area formed by the first electrode orthogonally projected on the conductive substrate and a first patterned dielectric projection area formed by the first patterned dielectric layer orthogonally projected on the conductive substrate have approximately the same profile.

According to an embodiment of the invention, one of the first patterned dielectric layer and the second patterned dielectric layer consists of a plurality of layers.

According to an embodiment of the invention, one of the first patterned dielectric layer and the second patterned dielectric layer consists of a single layer.

According to an embodiment of the invention, one of the first patterned dielectric layer and the second patterned dielectric layer is a distributed Bragg reflector (DBR).

According to an embodiment of the invention, the second portions of the transparent conductive layer and the second structure units of the second patterned dielectric layer are in contact with the metallic reflective layer to form a substantially flat contact plane.

According to an embodiment of the invention, the light-emitting structure layer includes a first GaN III-V group compound semiconductor layer, an active layer, and a second GaN III-V group compound semiconductor layer that are sequentially stacked.

According to an embodiment of the invention, the light-emitting device further includes a bonding layer configured between the metallic reflective layer and the conductive substrate, so as to bond the metallic reflective layer to the conductive substrate.

According to an embodiment of the invention, the metallic reflective layer is an adhesion layer.

According to an embodiment of the invention, first structure units and the second structure units respectively have an inclined side wall tilting with respect to a surface of the light-emitting structure layer.

Based on the above, in the light-emitting device of the invention, the structure units of the patterned dielectric layer are formed on one side of the transparent conductive layer close to the light-emitting structure layer and the other side of the transparent conductive layer close to the metallic reflective layer. Hence, the contact area between of the transparent conductive layer and the metallic reflective layer is reduced, and thereby reflectivity of the metallic reflective layer is not deteriorated by the subsequent heat treatment. In addition, the patterned dielectric layers on the semiconductor light-emitting device are arranged corresponding to the first electrode, which is conducive to uniformity of electric current distribution in the transparent conductive layer.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
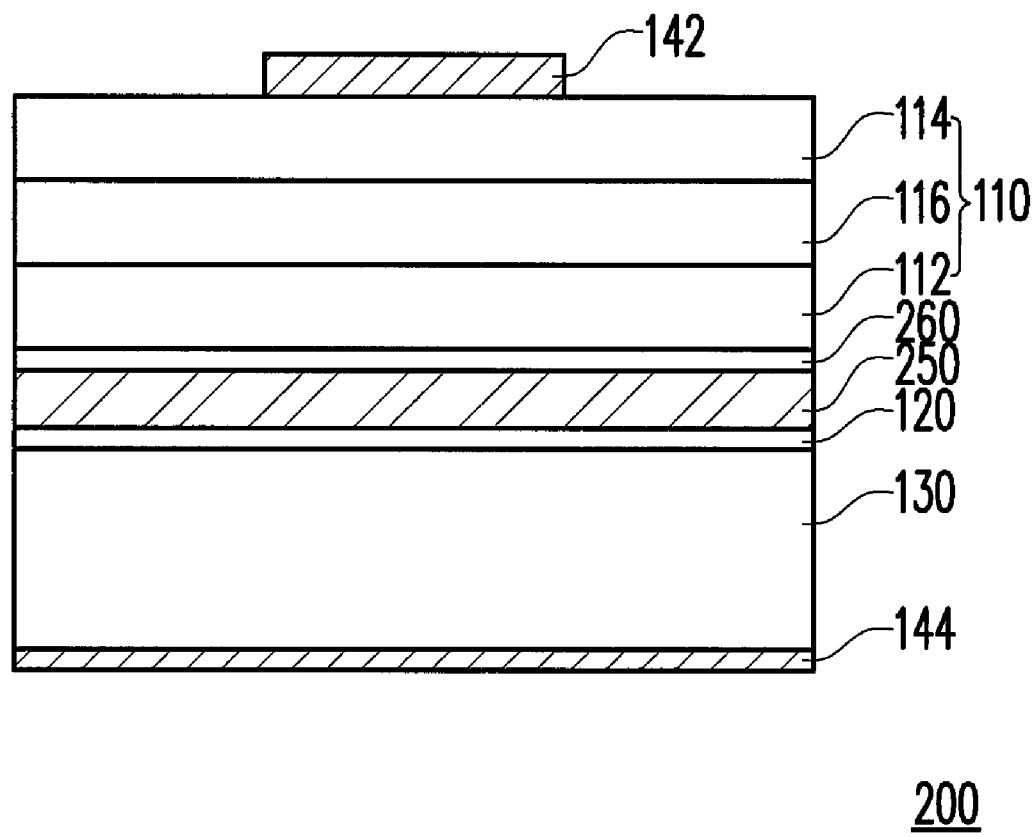
FIG. 1 is a schematic cross-sectional view illustrating a conventional LED chip.
Figure 2:
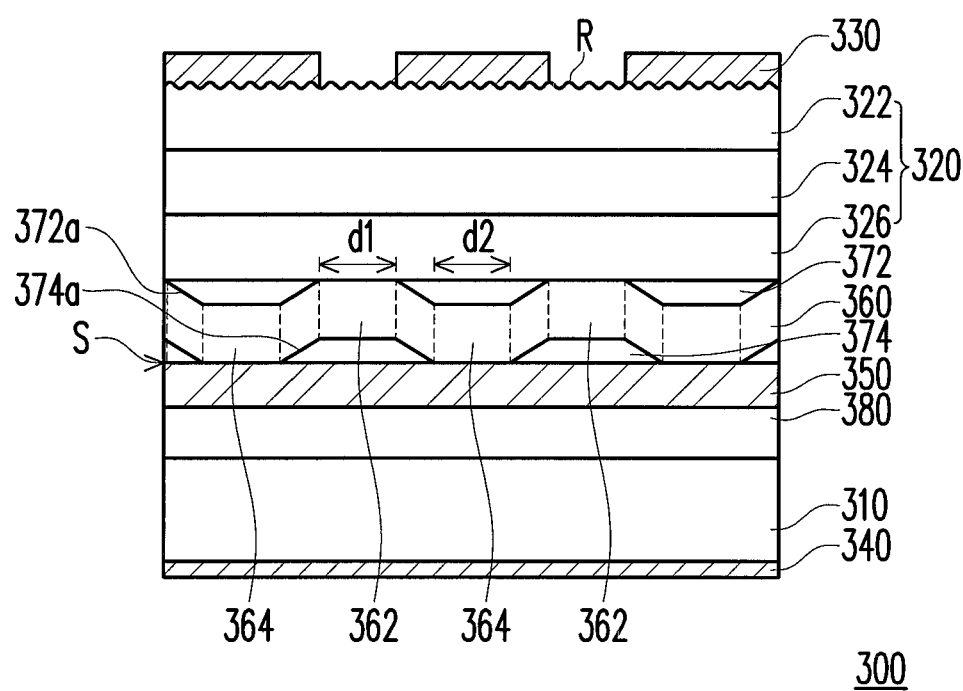
FIG. 2 is a schematic cross-sectional view illustrating a semiconductor light-emitting device according to an embodiment of the invention.

FIG. 2 is a schematic cross-sectional view illustrating a semiconductor light-emitting device according to an embodiment of the invention. With reference to FIG. 2, the semiconductor light-emitting device 300 includes a conductive substrate 310, a light-emitting structure layer 320, a first electrode 330, a second electrode 340, a metallic reflective layer 350, a transparent conductive layer 360, a first patterned dielectric layer 372, a second patterned dielectric layer 374, and a bonding layer 380. It should be mentioned that the above-mentioned devices should not be construed as limitations to the invention. In other embodiments of the invention, the light-emitting semiconductor device 300 can include other components.

Firstly, the light-emitting semiconductor device 300 is made by forming the light-emitting structure layer 320 on an epitaxial substrate (not shown), for instance. The light-emitting structure layer 320 includes a first semiconductor layer 322, an active layer 324, and a second semiconductor layer 326 that are sequentially stacked. In general, the first semiconductor layer 322 and the second semiconductor layer 326 have different dopants. For instance, the first semiconductor layer 322 and the second semiconductor layer 326 are respectively the n-type semiconductor layer and the p-type semiconductor layer. The active layer 324 is, for instance, an active quantum well layer. In addition, other film layers or other semiconductor layers with different dopant concentrations can be configured between any two of the first semiconductor layer 322, the active layer 324, and the second semiconductor layer 326. The first semiconductor layer 322 in the light-emitting structure layer 320 is, for instance, an N-GaN III-V group compound semiconductor layer, and the second semiconductor layer 326 in the light-emitting structure layer 320 is, for instance, a P-GaN III-V group compound semiconductor layer.

The first patterned dielectric layer 372 is then formed on the light-emitting structure layer 320 configured on the second semiconductor layer 326. That is to say, the second semiconductor layer 326 is located between the active layer 324 and the first patterned dielectric layer 372. In this embodiment, the first patterned dielectric layer 372 has specific patterns, and the light-emitting structure layer 320 is partially exposed by the specific patterns of the first patterned dielectric layer 372. Namely, the first patterned dielectric layer 372 includes a plurality of structure units (e.g., the trapezoid patterns shown in FIG. 2), and the structure units are separated from one another by a space d1. Besides, the structure unit of the first patterned dielectric layer 372 has an inclined side wall 372a that tilts with respect to a surface of the light-emitting structure layer 320. A material of the first patterned dielectric layer 372 is $Ta_2O_5$, $SiN_x$, $TiO_2$, or $SiO_2$, for instance. Here, the structure unit of the first patterned dielectric layer 372 can consist of a stacked plurality of layers which have two or more materials with different refractive indexes, for instance. Alternatively, the first patterned dielectric layer 372 can also be a distributed Bragg reflector (DBR) or be formed by patterns made of common dielectric materials. Certainly, the structure unit of the first patterned dielectric layer 372 can also consist of a single layer.

The transparent conductive layer 360 is formed on the first patterned dielectric layer 372. Here, the transparent conductive layer 360 exemplarily made of indium tin oxide (ITO), indium gallium oxide (IGO), and the like has favorable ohmic conductivity. According to this embodiment, the first patterned dielectric layer 372 has specific patterns, and the light-emitting structure layer 320 is partially exposed by the specific patterns of first patterned dielectric layer 372. The transparent conductive layer 360 is not configured on a flat plane but arranged along the side wall 372a, so as to form an uneven, bending structure. Hence, the transparent conductive layer 360 can be divided into first portions 362 and second portions 364. The first portions 362 of the transparent conductive layer 360 are located in the spaces d1, respectively. The first portions 362 are configured on the light-emitting structure layer 320, and the second portions 364 are configured on the first patterned dielectric layer 372. In FIG. 2, the first portions 362 contact the light-emitting structure layer 320, and the second portions 364 contact the first patterned dielectric layer 372. Besides, the first portions 362 and the second portions 364 are not overlapped and are alternately arranged.

The second patterned dielectric layer 374 is formed at a side of the transparent conductive layer 360 away from the first patterned dielectric layer 372. In this embodiment, the second patterned dielectric layer 374 is configured on the first portions 362 of the transparent conductive layer 360, for instance. In FIG. 2, the second patterned dielectric layer 374 contacts the first portions 362 of the transparent conductive layer 360. Besides, the second patterned dielectric layer 374 includes a plurality of structure units (e.g., the trapezoid patterns shown in FIG. 2), and the structure units are separated from one another by a space d2. The second portions 364 of the transparent conductive layer 360 are located in the second spaces d2 respectively, and each of the second portions 364 is between two adjacent structure units of the second patterned dielectric layer 374. In addition, the structure unit of the second patterned dielectric layer 374 can also have an inclined side wall 374a that tilts with respect to a surface of the light-emitting structure layer 320, such that the transparent conductive layer 360 is arranged along the side wall 374a. As such, the second portions 364 of the transparent conductive layer 360 and the structure units of the second patterned dielectric layer 374 together form a substantially flat contact plane S. The contact plane S is conducive to subsequent fabrication of other devices and improvement of device characteristics of the light-emitting semiconductor device 300.

Here, the structure unit of the second patterned dielectric layer 374 can consist of a stacked plurality of layers which have two or more materials with different refractive indexes, for instance. Alternatively, the second patterned dielectric layer 374 can also be a distributed Bragg reflector (DBR) or be formed by patterns made of common dielectric materials. Certainly, the structure unit of the second patterned dielectric layer 374 can consist of a single layer. In an embodiment of the invention, the structure unit of the first patterned dielectric layer 372 and the structure unit of the second patterned dielectric layer 374 can both consist of a stacked plurality of layers, or the first patterned dielectric layer 372 and the second patterned dielectric layer 374 can both be the DBRs.

The metallic reflective layer 350 is formed on the substantially flat contact plane S. The second portions 364 of the transparent conductive layer 360 and the structure units of the second patterned dielectric layer 374 are, at the contact plane S, alternately in contact with the metallic reflective layer 350. Undoubtedly, given another material layer is formed before the metallic reflective layer 350 is formed, the material layer is flat, and the second portions 364 of the transparent conductive layer 360 and the structure units of the second patterned dielectric layer 374 are, at the contact plane S, alternately in contact with the material layer. Namely, the embodiment does not pose limitations to the second portions 364 of the transparent conductive layer 360 and the structure units of the second patterned dielectric layer 374 that are alternately in contact with the metallic reflective layer 350 at the contact plane S.

Since the contact plane S is a flat surface, the metallic reflective layer 350 can be neatly formed on the second portions 364 of the transparent conductive layer 360 and the structure units of the second patterned dielectric layer 374. Therefore, the metallic reflective layer 350 can be characterized by favorable conductivity. Additionally, the metallic reflective layer 350 of this embodiment is partially in contact with the transparent conductive layer 360, which better prevents the reflectivity of the metallic reflective layer 350 from being negatively affected by the high temperature at which the subsequent fabricating processes are performed. In particular, the mutual diffusion between the metallic reflective layer 350 and the transparent conductive layer 360 can be effectively precluded. As a result, the metallic reflective layer 350 can be characterized by favorable reflectivity, and desirable light extraction efficiency of the light-emitting semiconductor device 300 can be guaranteed.

After the above-mentioned processes are performed, the light-emitting structure layer 320, the first patterned dielectric layer 372, the transparent conductive layer 360, the second patterned dielectric layer 374, and the metallic reflective layer 350 are stacked on the epitaxial substrate (not shown). A bonding process is then performed to bond the stacked structure to the conductive substrate 310 through the bonding layer 380, and the stacked structure is removed from the epitaxial substrate (not shown). Specifically, the conductive substrate 310 can be a silicon substrate, a circuit board, a metallic substrate, and so on. The bonding layer 380 is configured between the metallic reflective layer 350 and the conductive substrate 310 in order to bond the metallic reflective layer 350 to the conductive substrate 310. The metallic reflective layer 350 can be made of metal with great light reflectivity, such as silver, aluminum, gold, an alloy thereof, and so forth. Besides, the metallic reflective layer 350 can be formed by eutectic bonding, such that the metallic reflective layer 350 can act as the adhesion layer as well. It should be noted that the adhesion function of the metallic reflective layer 350 is not necessarily required in this invention. In addition, the bonding layer 380 can be made of metallic materials or organic materials with conductive particles. The transparent conductive layer 360 can be made of transparent metallic oxide, such as ITO, CTO, ZnO, $In_2O_3$, $SnO_2$, $CuAlO_2$, $CuGaO_2$, $SrCu_2O_2$, and so on. In this embodiment, the transparent conductive layer 360 can be made of ITO.

Besides, after the epitaxial substrate (not shown) is removed, the first semiconductor layer 322 has a rough surface R at a side away from the active layer 324, for example, while the rough surface R of the first semiconductor layer 322 is not necessarily required in this invention.

The first electrode 330 and the second electrode 340 are then respectively configured at an outer side of the light-emitting structure layer 320 and an outer side of the conductive substrate 310, so as to form the light-emitting semiconductor device 300. In the light-emitting semiconductor device 300, the light-emitting structure layer 320 is configured on the conductive substrate 310. The metallic reflective layer 350 is configured between the light-emitting structure layer 320 and the conductive substrate 310. The transparent conductive layer 360 is configured between the light-emitting structure layer 320 and the metallic reflective layer 350. The first patterned dielectric layer 372 is configured between the light-emitting structure layer 320 and the transparent conductive layer 360, and the first portions 362 of the transparent conductive layer 360 and the structure units of the first patterned dielectric layer 372 are alternately arranged at a side of the light-emitting structure layer 320. The second patterned dielectric layer 374 is configured between the transparent conductive layer 360 and the metallic reflective layer 350, and the second portions 364 of the transparent conductive layer 360 and the structure units of the second patterned dielectric layer 374 are alternately arranged at a side of the metallic reflective layer 350.

Thereby, the metallic reflective layer 350 is partially in contact with the transparent conductive layer 360, which better prevents the reflectivity of the metallic reflective layer 350 from being negatively affected by the high temperature at which the fabricating processes (e.g., the bonding process) are performed. As a result, the metallic reflective layer 350 can be characterized by favorable reflectivity, and desirable light extraction efficiency of the light-emitting semiconductor device 300 can be guaranteed. On the other hand, the metallic reflective layer 350 is configured on the substantially flat contact plane S; therefore, the metallic reflective layer 350 can have a flat structure and satisfactory conductivity.

To be more specific, the structure units of the first patterned dielectric layer 372 and the structure units of the second patterned dielectric layer 374 are alternately arranged, and the structure units of the first patterned dielectric layer 372 is arranged corresponding to the first electrode 330. Hence, when the electric current is transmitted between the metallic reflective layer 350 and the light-emitting structure layer 320, the electric current can be laterally transmitted from the first portions 362 to the second portions 364 or from the second portions 364 to the first portions 362. That is to say, the electric current of the first electrode 330 is not vertically transmitted and is thus not limited to be in the second portions 364, which is conducive to spreading distribution of the electric current and uniformity of electric current distribution density. Since the luminance efficiency of the light-emitting semiconductor device 300 is not apt to be restricted by the overly concentrated electric current, the light-emitting semiconductor device 300 can have favorable operation efficacy (light-to-electricity conversion efficiency).

In this embodiment, the first electrode 330 is configured at a side of the light-emitting structure layer 320 away from the conductive substrate 310. The second electrode 340 is configured at a side of the conductive substrate 310 away from the light-emitting structure layer 320. That is to say, the first electrode 330 and the second electrode 340 are located at two respective sides of the light-emitting semiconductor device 300. Here, the light-emitting semiconductor device 300 is a vertical light-emitting semiconductor device, for instance.

Figure 3:
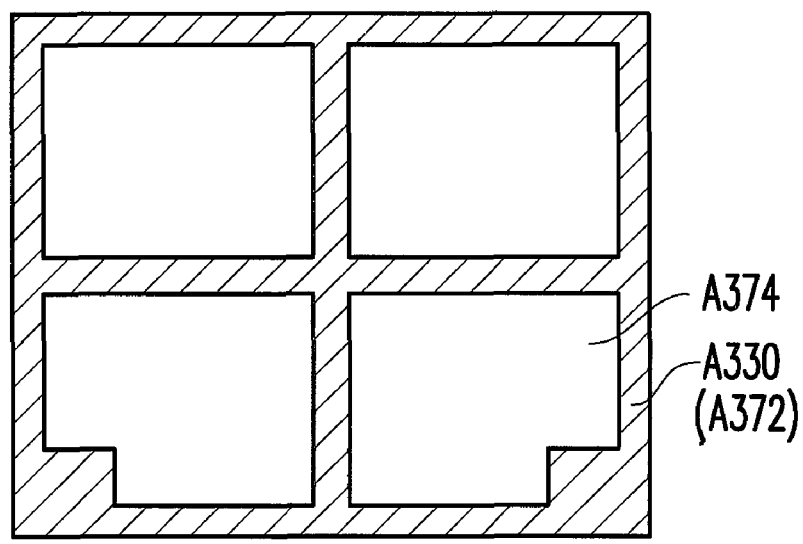
FIG. 3 is a schematic top view illustrating a semiconductor light-emitting device according to an embodiment of the invention.

It should be mentioned that the first electrode 330 is formed by a patterned conductive electrode, for example. Here, the first electrode 330 and the first patterned dielectric layer 372 have corresponding patterns. FIG. 3 is a schematic top view illustrating a light-emitting semiconductor device according to an embodiment of the invention. With reference to FIG. 2 and FIG. 3, an electrode pattern projection area A330 is formed by the first electrode 330 orthogonally projected on the conductive substrate 310. A first patterned dielectric projection area A372 is formed by the first patterned dielectric layer 372 orthogonally projected on the conductive substrate 310. The electrode pattern projection area A330 covers and is overlapped with the first patterned dielectric projection area A372. Namely, the electrode pattern projection area A330 and the first patterned dielectric projection area A372 have the same profile. By contrast, a second patterned dielectric projection area A374 is formed by the second patterned dielectric layer 374 orthogonally projected on the conductive substrate 310. The electrode pattern projection area A330 and the second patterned dielectric projection area A374 have different profiles. In other embodiments of the invention, the electrode pattern projection area A330 can be smaller than the first patterned dielectric projection area A372, such that the first patterned dielectric projection area A372 is partially exposed. Note that the electrode pattern projection area A330 and the first patterned dielectric projection area A372 have substantially the same shape.

In light of the foregoing, the transparent conductive layer is configured between the metallic reflective layer and the light-emitting structure layer in the light-emitting semiconductor device of the invention, and two patterned dielectric layers are respectively configured at two sides of the transparent conductive layer. Thanks to the two patterned dielectric layers, the metallic reflective layer can be configured on the flat contact plane, the metallic reflective layer is partially in contact with the transparent conductive layer, and the electric current can be laterally transmitted. Consequently, the metallic reflective layer can have favorable reflectivity and conductivity. On the other hand, the first patterned dielectric layer is arranged corresponding to the first electrode, which contributes to uniformity of the electric current distribution density of the light-emitting semiconductor device. As a whole, the light-emitting semiconductor device is characterized with favorable operating efficacy and desirable light extraction efficiency.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A light-emitting device comprising:
   a conductive substrate;
   a light-emitting structure layer configured above the conductive substrate;
   a metallic reflective layer configured between the light-emitting structure layer and the conductive substrate;
   a transparent conductive layer configured between the light-emitting structure layer and the metallic reflective layer;
   a first patterned dielectric layer configured between the light-emitting structure layer and the transparent conductive layer, the first patterned dielectric layer comprising a plurality of first structure units, the first structure units being separated from one another by a first space, wherein first portions of the transparent conductive layer are located in the first spaces respectively; and
   a second patterned dielectric layer configured between the transparent conductive layer and the metallic reflective layer, the second patterned dielectric layer comprising a plurality of second structure units, the second structure units being separated from one another by a second space, wherein second portions of the transparent conductive layer are located in the second spaces respectively, and the first portions and the second portions are not overlapped.

2. The light-emitting device as claimed in claim 1, further comprising:
   a first electrode configured at a side of the light-emitting structure layer away from the conductive substrate; and
   a second electrode configured at a side of the conductive substrate away from the light-emitting structure layer.

3. The light-emitting device as claimed in claim 2, wherein an electrode pattern projection area formed by the first electrode orthogonally projected on the conductive substrate and a first patterned dielectric projection area formed by the first patterned dielectric layer orthogonally projected on the conductive substrate have an approximate same profile.

4. The light-emitting device as claimed in claim 1, wherein one of the first structure units and the second structure units consists of a plurality of layers.

5. The light-emitting device as claimed in claim 1, wherein one of the first structure unit and the second structure unit consists of a single layer.

6. The light-emitting device as claimed in claim 1, wherein one of the first patterned dielectric layer and the second patterned dielectric layer is a distributed Bragg reflector.

7. The light-emitting device as claimed in claim 1, wherein the second portions of the transparent conductive layer and the second structure units of the second patterned dielectric layer are in contact with the metallic reflective layer to form a substantially flat contact plane.

8. The light-emitting device as claimed in claim 1, wherein the light-emitting structure layer comprises a first GaN III-V group compound semiconductor layer, an active layer, and a second GaN group compound semiconductor layer sequentially stacked.

9. The light-emitting device as claimed in claim 1, further comprising a bonding layer configured between the metallic reflective layer and the conductive substrate.

10. The light-emitting device as claimed in claim 1, wherein the metallic reflective layer is an adhesion layer.

11. The light-emitting device as claimed in claim 1, wherein the first structure units and the second structure units respectively have an inclined side wall tilting with respect to a surface of the light-emitting structure layer.

* * * * *